(12) United States Patent
Wilcoxon et al.

(10) Patent No.: US 7,830,021 B1
(45) Date of Patent: Nov. 9, 2010

(54) TAMPER RESISTANT PACKAGING WITH TRANSIENT LIQUID PHASE BONDING

(75) Inventors: Ross K. Wilcoxon, Cedar Rapids, IA (US); Alan P. Boone, Swisher, IA (US); James R. Wooldridge, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1259 days.

(21) Appl. No.: 11/220,237

(22) Filed: Sep. 6, 2005

(51) Int. Cl.
*H01L 21/31* (2006.01)

(52) U.S. Cl. .............. 257/778; 257/790; 257/738; 257/690; 257/686

(58) Field of Classification Search ............ 257/738, 257/777, 778, 780, 690, 686
See application file for complete search history.

(56) References Cited

U.S. PATENT DOCUMENTS

| | | | | |
|---|---|---|---|---|
| 5,829,124 A * | 11/1998 | Kresge et al. | ................. | 29/840 |
| 5,834,323 A * | 11/1998 | Ghafghaichi et al. | .......... | 438/17 |
| 6,002,177 A * | 12/1999 | Gaynes et al. | ............... | 257/774 |
| 6,066,808 A * | 5/2000 | Kresge et al. | ................ | 174/262 |
| 6,069,023 A * | 5/2000 | Bernier et al. | ............... | 438/107 |
| 6,187,678 B1 * | 2/2001 | Gaynes et al. | ............... | 438/667 |
| 6,236,115 B1 * | 5/2001 | Gaynes et al. | ............... | 257/774 |
| 6,399,896 B1 * | 6/2002 | Downes et al. | .............. | 174/260 |
| 7,187,070 B2 * | 3/2007 | Chu et al. | ................... | 257/686 |
| 2002/0041037 A1 * | 4/2002 | Kobayashi et al. | .......... | 257/778 |
| 2002/0092895 A1 * | 7/2002 | Blackshear et al. | ......... | 228/226 |
| 2003/0030149 A1 * | 2/2003 | Miura et al. | ................. | 257/772 |
| 2004/0188706 A1 * | 9/2004 | Chang et al. | ................ | 257/177 |
| 2006/0027899 A1 * | 2/2006 | Humpston et al. | .......... | 257/668 |
| 2007/0034305 A1 * | 2/2007 | Suh | ............................ | 148/561 |

* cited by examiner

*Primary Examiner*—Mary Wilczewski
*Assistant Examiner*—Telly D Green
(74) *Attorney, Agent, or Firm*—Matthew J. Evans; Daniel M. Barbieri

(57) ABSTRACT

A tamper resistant semiconductor package includes a surface having flip chip electrical contacts. A flip chip semiconductor of the package also has flip chip electrical contacts. The flip chip semiconductor has a maximum temperature to which it can be exposed before being damaged. Flip chip solder joints physically couple and electrically connect the flip chip electrical contacts of the flip chip semiconductor to the flip chip electrical contacts of the surface. The flip chip solder joints are formed of an alloy having a higher melting point than the maximum temperature such that removal of the flip chip semiconductor from the surface by heating will destroy the functionality of the flip chip semiconductor.

10 Claims, 3 Drawing Sheets

TAMPER RESISTANT PACKAGING WITH TRANSIENT LIQUID PHASE BONDING

BACKGROUND

Disclosed embodiments relate generally to packaging of semiconductors. More particularly, disclosed embodiments relate to semiconductor packages which are resistant to tampering, i.e. reverse engineering the function of, or extracting information from, the semiconductor device in the package.

The discussion below is merely provided for general background information and is not intended to be used as an aid in determining the scope of the claimed subject matter.

In many applications, it can be beneficial to make semiconductor packages as tamper resistant as possible. For example, there are many instances where it could be desirable to either prevent reverse engineering of a semiconductor package, or at least to make reverse engineering a more difficult task. This can be true both with respect to protecting proprietary aspects of the semiconductor package circuitry itself, and with respect to protecting proprietary aspects of software used to program the semiconductor package.

One current approach to making semiconductor packages tamper resistant includes applying a specialized coating to a sensitive die. Efforts to remove the coating to access the die for reverse engineering hopefully then damage the die, which in many instances would prevent the goal of the tampering efforts (i.e., copying, reverse engineering, etc.) from being achieved. Application of the specialized coating can have certain associated costs or disadvantages. For example, the process of applying the specialized coating can be time consuming, potentially increasing associated manufacturing costs. The process can also be difficult to perform consistently on a large number of semiconductor packages. Further, the specialized coating and/or its application process can adversely impact component reliability, for example by interfering with component cooling, etc.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A tamper resistant semiconductor package includes a surface having flip chip electrical contacts. A flip chip semiconductor of the package also has flip chip electrical contacts. The flip chip semiconductor has a maximum temperature to which it can be exposed before being damaged. Flip chip solder joints physically couple and electrically connect the flip chip electrical contacts of the flip chip semiconductor to the flip chip electrical contacts of the surface. The flip chip solder joints are formed of an alloy having a higher melting point than the maximum allowable temperature of the semiconductor device such that removal of the flip chip semiconductor from the surface by heating will destroy the functionality of the flip chip semiconductor. The flip chip solder joints are formed using a transient liquid phase (TLP) bonding process in which a first metal in the liquid state is diffused into a second metal while the second metal is in the solid state.

BRIEF DESCRIPTION OF THE DRAWINGS

FIG. 2 is a diagrammatic side view of the tamper resistant semiconductor package of FIGS. 1-1, illustrating configuration of first and second semiconductors with first and second data portions of a data set.

FIGS. 4-1 through 4-6 are diagrammatic side views illustrating a method of producing a tamper resistant semiconductor package.

DETAILED DESCRIPTION

Disclosed embodiments provide tamper resistant semiconductor packages, as well as methods of producing the same. In some embodiments, the tamper resistant techniques disclosed here are used to produce semiconductor packages in a cost efficient manner relative to some conventional tamper resistant techniques. Also, in some embodiments, the tamper resistant techniques help to achieve an increase in packaging density of electronics. The disclosed techniques utilize a flip chip semiconductor, and flip chip solder joints which are formed of an alloy material having a higher melting point than the maximum temperature that the flip chip semiconductor can withstand before being damaged. This makes it more difficult to remove the flip chip semiconductor without causing significant damage. In exemplary embodiments, the flip chip solder joints are formed using transient liquid phase (TLP) bonding that produces an alloy by allowing for the diffusion of one metal while in the liquid state into another solid metal, producing an alloy with a melting temperature which is above the maximum temperature that the die can be exposed to before damage occurs. Using TLP bonding, the diffusion which produces the alloy can be achieved with processing temperatures below this maximum temperature so that the semiconductor die is not damaged during production.

Figure 1:
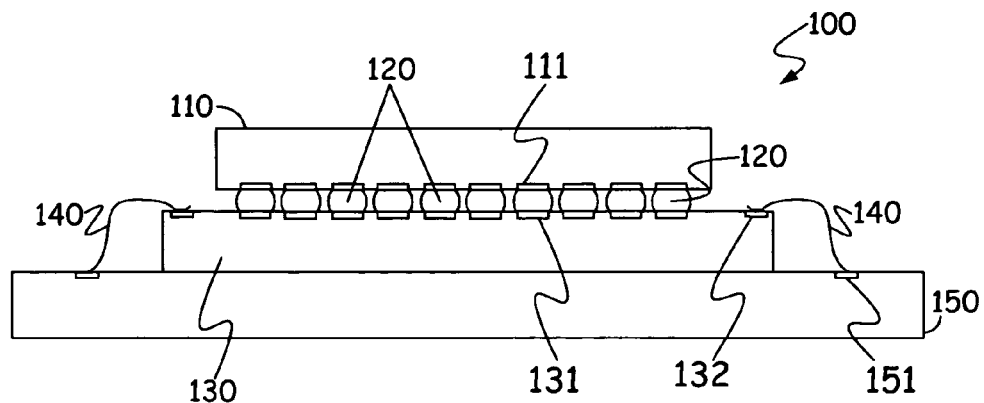
FIGS. 1-1 and 1-2 are diagrammatic side views of tamper resistant semiconductor packages.

Referring now to FIGS. 1-1, shown is a first embodiment of a semiconductor package 100 which includes one or more tamper resistant features. Tamper resistant semiconductor package 100 includes a flip chip semiconductor 110 having flip chip electrical contacts 111. Electrical contacts 111 of flip chip semiconductor 110 are physically coupled and electrically connected to flip chip electrical contacts 131 of a surface using flip chip solder joints 120. In the embodiment illustrated in FIGS. 1-1, the surface to which the flip chip semiconductor 110 is coupled is a second semiconductor 130. In this particular embodiment, the second semiconductor 130 is a wire bond die semiconductor, though this need not be the case in other embodiments. Also in this particular embodiment, second semiconductor 130 includes wire bond electrical contacts 132 which electrically connect this semiconductor to wire bond electrical contacts 151 of a substrate 150 using wire bonds 140. In another embodiment illustrated in FIGS. 1-2, the semiconductor 130 is also a flip chip semiconductor. In this embodiment, semiconductor 130 includes through-die vias 135 that allow bumps on either side of semiconductor 130. As will be described below, the bumps are used in forming solder joints such as solder joints 120 and 136. The example embodiments illustrated in FIGS. 1-1 and 1-2 do not limit the invention to any particular type of second semiconductor, but rather, provide illustrations of two types of semiconductors which can be used.

As is known in the art, semiconductor devices generally have maximum temperatures to which they can be exposed before being destroyed or damaged. The maximum temperature can be the same for all semiconductors in a package, or it can differ for each semiconductor. In disclosed embodiments, the flip chip solder joints 120 are formed of an alloy having a higher melting point than this maximum temperature such that removal of the flip chip semiconductor 110 from the surface (in this example the surface of semiconductor 130) by heating will destroy the functionality of the flip chip semiconductor and/or the second semiconductor.

In exemplary embodiments, the flip chip solder joints are formed using a TLP bonding process. The resulting solder joints, produced using the TLP bonding process, can be referred to as TLP solder joints, even though the solder joints do not remain in the TLP. The flip chip or TLP solder joints have a first metal diffused into a second metal such that the resulting alloy has a higher melting point or temperature than the maximum temperature which one or more of the semiconductors of the package 100 can withstand before being damaged or destroyed. The first metal has a melting point below this maximum temperature, and the second metal has a melting point above the maximum temperature. This combination allows the first metal to be heated to or past its melting point, such that it can diffuse into the second metal to form the solder joint, without exposing the semiconductor package to temperatures above the maximum temperature.

In one example embodiment, the first and second metals can be respectively tin (Sn) and gold (Au). A relatively smaller quantity of tin can be used, as compared to the quantity of gold used, to increase the melting temperature of the resulting gold-tin alloy. For example, in one example embodiment, the alloy comprises by weight approximately 95 percent gold and approximately 5 percent tin. The melting point of tin is 231.93° C., while the melting point of gold is 1064.18° C. Therefore, assuming that the maximum temperature to which a semiconductor can be exposed is between these to melting points, the solder joints can be formed by heating to a temperature of at least 231.93° C. to allow the tin to diffuse into the gold, but not to a temperature above the maximum temperature. The resulting alloy will have a melting point above the maximum temperature, but below the melting point of the gold. Other TLP alloys that can be used for the solder joints include, for example, silver (Ag)-indium (In) alloys and copper (Cu)-tin (Sn) alloys. Still other alloys can be used, including alloys having three or more metals. In these alloys, the first metal as referred to above and in the claims is a metal having a melting point below the maximum temperature, while a second metal is a metal having a melting point above the maximum temperature.

Figures 1, 2:
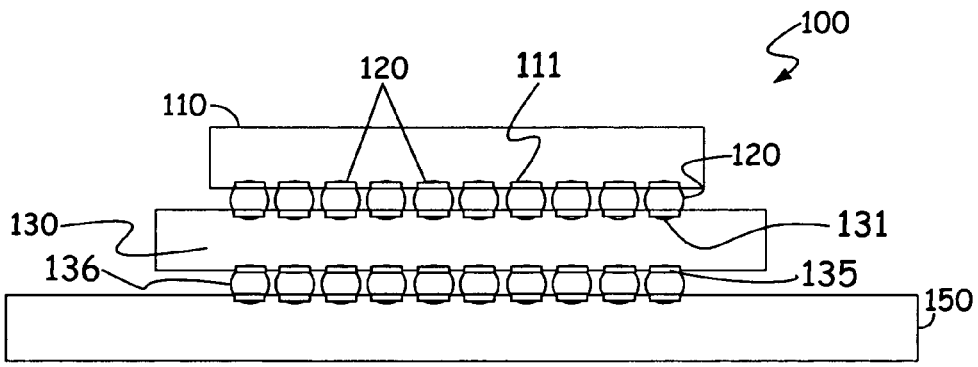
Figure 2:
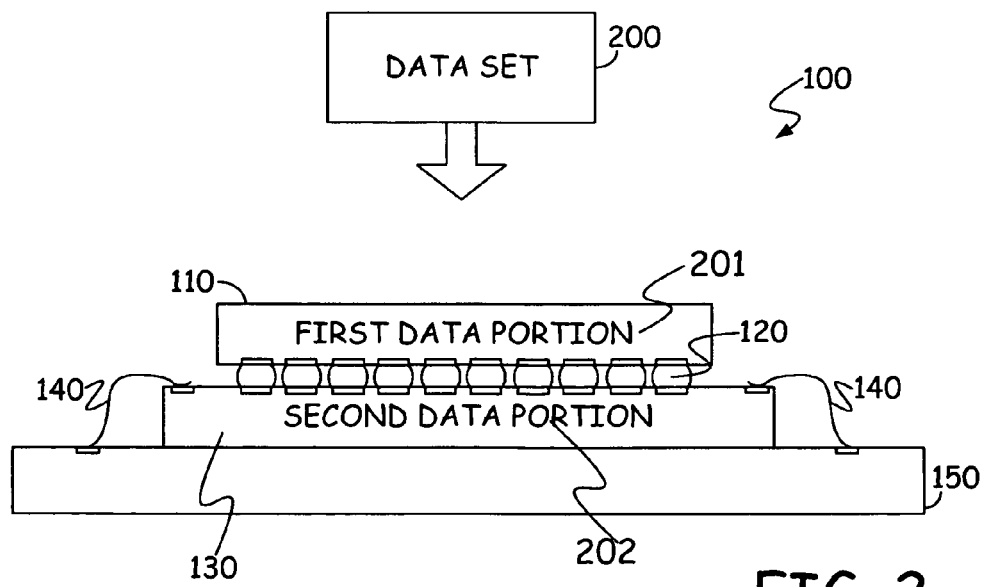

Referring now to FIG. 2, shown is a diagrammatic illustration of a feature of some disclosed embodiments. FIG. 2 illustrates tamper resistant semiconductor package 100 in conjunction with a data set 200 which, when used to program semiconductors 110 and 130 of the package, define the functionality of the semiconductor package. As shown diagrammatically in FIG. 2, the data set 200 comprises two data portions. A first data portion 201 of the data set is used to program or configure flip chip semiconductor 110, while a second data portion 202 of the data set is used to program or configure the second semiconductor (in this example, wire bond die semiconductor 130). The first and second data portions can be selected or created such that functionality of the tamper resistant semiconductor package 100 cannot be fully identified without both of the flip chip semiconductor 110 and the second semiconductor 130 in operating condition. This separation of functional data, between semiconductors 110 and 130 connected using TLP solder joints, provides an added tamper resistant feature. Using this technique, if either semiconductor is damaged or destroyed by heating used to separate or disbond the solder joints, the functions of the semiconductor package become more difficult to ascertain.

Figure 3:
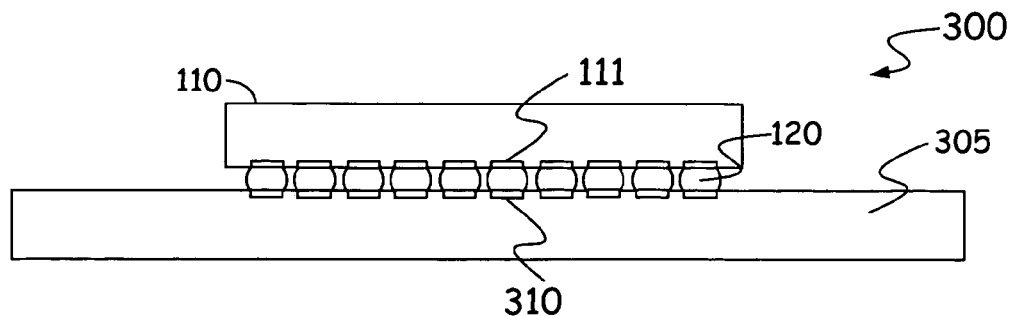
FIG. 3 is a diagrammatic side view of a tamper resistant semiconductor package.

Referring now to FIG. 3, shown is a semiconductor package 300 which includes only one semiconductor, in this case flip chip semiconductor 110. In this embodiment, flip chip semiconductor 110 is physically connected and electrically coupled using TLP solder joints 120 as described above with reference to semiconductor package 100. However, the surface to which it is coupled is a surface of a substrate 305. As illustrated, solder joints 120 couple flip chip electrical contacts 111 of semiconductor 110 to flip chip electrical contacts 310 of substrate 305. As described above, semiconductor package 300 has tamper resistance provided by solder joints 120 being formed of an alloy having a higher melting point than the maximum temperature, i.e., the temperature above which semiconductor 110 will be damaged or destroyed.

Figures 1, 4:
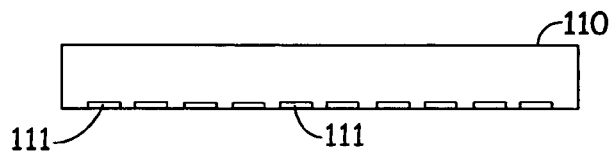
Figures 2, 4:
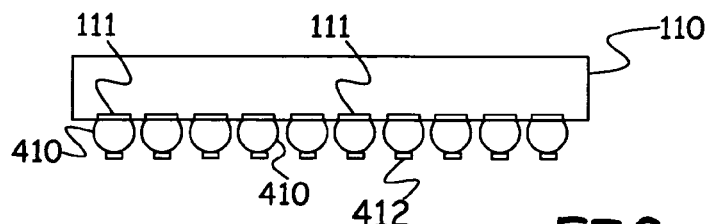
Figures 3, 4:
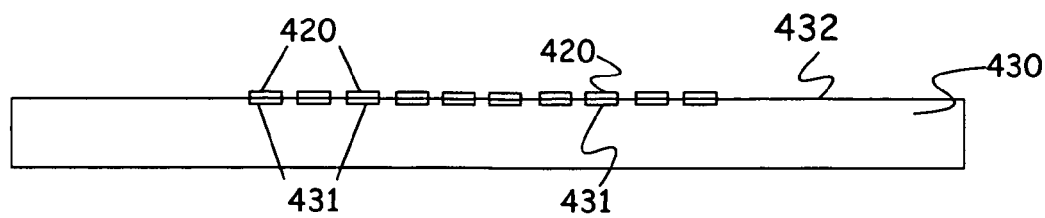
Figure 4:
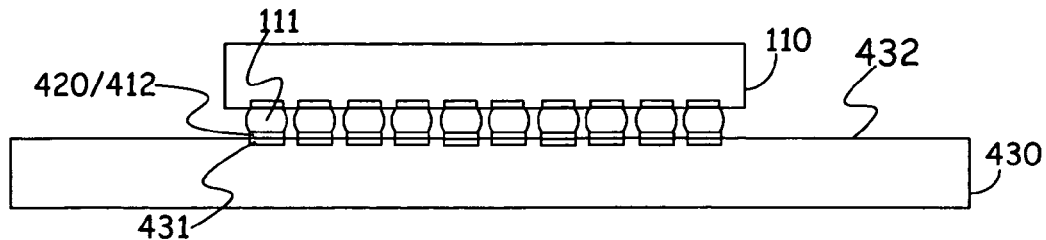

Referring now to FIGS. 4-1 through 4-6, diagrammatically illustrated are steps of a method of producing tamper resistant semiconductor packages. These steps are illustrated in conjunction with FIGS. 1-3 described above. As shown in FIGS. 4-1, the method includes providing a flip chip semiconductor 110 having flip chip electrical contacts 111. As noted above, the semiconductor 110 has a maximum temperature to which it can be exposed before being damaged. Another step of the method includes providing a surface 432 having flip chip electrical contacts 431. This step is illustrated in various FIGS., for example including FIGS. 4-3. Structure 430 on which surface 432 and electrical contacts 431 are positioned can be a second semiconductor (e.g., semiconductor 130 shown in FIGS. 1-1, 1-2 and 2), a substrate (e.g., substrate 305 shown in FIG. 3) or other structure.

Next, the method includes the step of forming alloy solder joints 450 using a TLP bonding process. Solder joints 450 are diagrammatically illustrated in a completed form in FIGS. 4-6, and correspond to solder joints 120 shown in FIGS. 1-3. As such, the alloy solder joints 450 are formed between the flip chip electrical contacts 111 of the flip chip semiconductor 110 and the flip chip electrical contacts 431 of the surface 432, such that the alloy solder joints physically couple and electrically connect the flip chip semiconductor to the surface. As was described with reference to solder joints 120 shown in FIGS. 1-3, the alloy solder joints 450 have a higher melting point than the maximum temperature to which the flip chip semiconductor 110 can be exposed before being damaged In example embodiments, the step of forming the alloy solder joints 450 using the TLP bonding process further comprises positioning first and second metals between flip chip electrical contacts 111 of the flip chip semiconductor 110 and corresponding flip chip electrical contacts 431 of the surface 432 (for example the surface of a second semiconductor). In exemplary embodiments, the first metal has a melting point below the maximum temperature and the second metal has a melting point above the maximum temperature. The steps of positioning the first and second metals is further illustrated in FIGS. 4-2 and 4-3.

As shown in FIGS. 4-2, the second metal (e.g., gold in some embodiments) is used to form bumps 410 on flip chip electrical contacts 111 of the flip chip semiconductor 110. Then, the first metal 420 (e.g., tin in some embodiments) is deposited on one or both of the bumps 410 and the flip chip electrical contacts 431 of the surface 432. In FIGS. 4-2, this step is illustrated by the deposition of tin 412 on bumps 410. In FIGS. 4-3, this step is illustrated by the deposition of tin 420 on contacts 431. In many embodiments, deposition of the first metal would only occur on one of bumps 410 and contacts 431, but is illustrated in FIGS. 4-2 and 4-3 on each of bumps 410 and contacts 431 for illustrative purposes of the alternative embodiments. Then, the flip chip semiconductor 110 is placed adjacent to the surface 432 (e.g., adjacent a second semiconductor) such that the flip chip electrical contacts 111 of the flip chip semiconductor, the bumps 410 comprised of the second metal, the first metal deposits 420 and/or 412, and the flip chip electrical contacts 431 are in series (e.g., stacked) or electrical contact. This is represented in FIG. 4-4.

Figures 4, 5:
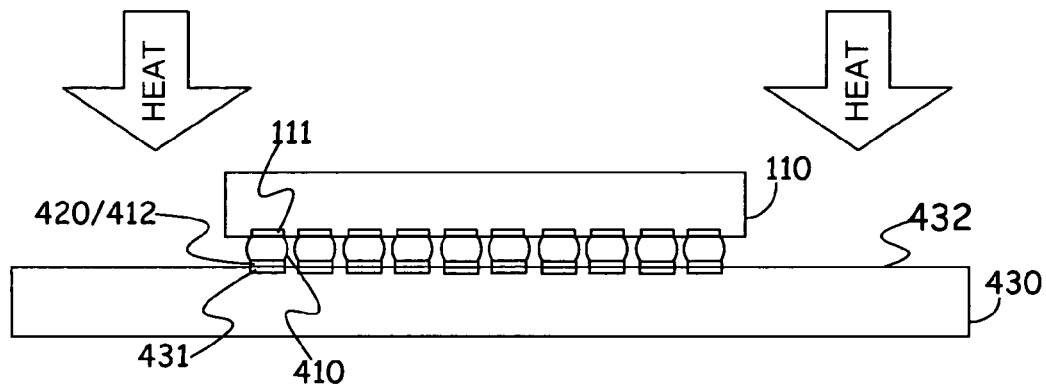
Figures 4, 5, 6:
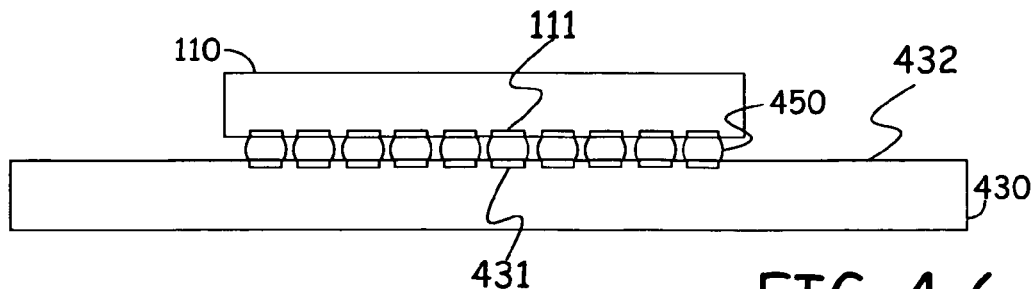

Next, the first metal 420 and/or 412 is diffused into the second metal 410 to form the alloy solder joints 450. This is accomplished by heating the first and second metals to a temperature which is below the maximum temperature but at or above the melting point of the first metal. FIGS. 4-5 diagrammatically illustrates the process of heating the first and second metals to facilitate the diffusion which occurs in the TLP bonding process. As mentioned above, the resulting solder joints 450 are shown in FIG. 4-6.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A tamper resistant semiconductor package, comprising:
   a surface having flip chip electrical contacts;
   a flip chip semiconductor having flip chip electrical contacts, wherein the flip chip semiconductor is configured with at least a portion of data from a data set defining functionality of the flip chip semiconductor, the flip chip semiconductor having a maximum temperature to which it can be exposed before being damaged by heating such that the functionality of the flip chip semiconductor defined by the at least a portion of the data from the data set is destroyed; and
   flip chip solder joints physically coupling and electrically connecting the flip chip electrical contacts of the flip chip semiconductor to the flip chip electrical contacts of the surface while the flip chip semiconductor is undamaged and fully functional such that it can perform the functionality defined by the at least a portion of data from the data set, wherein the flip chip solder joints are formed of an alloy having a higher melting point than the maximum temperature such that the flip chip semiconductor cannot be removed from the surface by heating without damaging and destroying the functionality of the flip chip semiconductor.

2. The tamper resistant semiconductor package of claim 1, wherein the flip chip solder joints are transient liquid phase solder joints having a first metal diffused into a second metal such that the resulting alloy has a higher melting point than the maximum temperature to which the flip chip semiconductor can be exposed before being damaged by heating such that the functionality of the flip chip semiconductor defined by the at least a portion of the data from the data set is destroyed.

3. The tamper resistant semiconductor package of claim 2, wherein the first metal has a melting point below the maximum temperature to which the flip chip semiconductor can be exposed before being damaged by heating such that the functionality of the flip chip semiconductor defined by the at least a portion of the data from the data set is destroyed, and the second metal has a melting point above the maximum temperature to which the flip chip semiconductor can be exposed before being damaged by heating such that the functionality of the flip chip semiconductor is destroyed.

4. The tamper resistant semiconductor package of claim 2, wherein the surface is a surface of a substrate.

5. The tamper resistant semiconductor package of claim 2, wherein the surface is a surface of a wire bond die semiconductor, the surface of the wire bond die semiconductor further having wire bond electrical contacts, and the tamper resistant semiconductor package further comprising:
   a substrate on which the wire bond die semiconductor is positioned, the substrate having wire bond electrical contacts; and
   wire bonds electrically connecting the wire bond electrical contacts of the wire bond die semiconductor and the wire bond electrical contacts of the substrate.

6. The tamper resistant semiconductor package of claim 2, wherein the surface is a surface of a second semiconductor, wherein the flip chip semiconductor is configured with a first data portion of the data set defining functionality of the tamper resistant semiconductor package, and wherein the second semiconductor is configured with a second data portion of the data set defining functionality of the tamper resistant semiconductor package, such that functionality of the tamper resistant semiconductor package cannot be fully identified without both of the flip chip semiconductor and the second semiconductor in operating condition.

7. The tamper resistant semiconductor package of claim 2, wherein the flip chip solder joints comprise a gold (Au)-tin (Sn) alloy.

8. The tamper resistant semiconductor package of claim 7, wherein the gold-tin alloy comprises more than ninety-five percent gold and less than five percent tin by weight.

9. The tamper resistant semiconductor package of claim 2, wherein the flip chip solder joints comprise a silver (Ag)-indium (In) alloy.

10. The tamper resistant semiconductor package of claim 2, wherein the flip chip solder joints comprise a copper (Cu)-tin (Sn) alloy.

* * * * *